(12) United States Patent
Yeh

(10) Patent No.: US 12,218,674 B2
(45) Date of Patent: Feb. 4, 2025

(54) SIGNAL GENERATING CIRCUIT AND SIGNAL GENERATING METHOD

(71) Applicant: REALTEK SEMICONDUCTOR CORP., Hsinchu (TW)

(72) Inventor: Chih-Yuan Yeh, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 7 days.

(21) Appl. No.: 18/225,463

(22) Filed: Jul. 24, 2023

(65) Prior Publication Data
US 2024/0030924 A1    Jan. 25, 2024

(30) Foreign Application Priority Data
Jul. 25, 2022  (TW) .................................. 111127845

(51) Int. Cl.
*H03L 7/07*  (2006.01)
*H03K 3/037*  (2006.01)
*H03K 5/00*  (2006.01)

(52) U.S. Cl.
CPC ............... *H03L 7/07* (2013.01); *H03K 3/037* (2013.01); *H03K 5/00006* (2013.01)

(58) Field of Classification Search
None
See application file for complete search history.

(56) References Cited

U.S. PATENT DOCUMENTS

| | | | |
|---|---|---|---|
| 4,389,643 A | 6/1983 | Hill | |
| 9,503,109 B2 | 11/2016 | McLaurin et al. | |
| 10,623,174 B1 * | 4/2020 | Remla | H04L 7/0029 |

\* cited by examiner

*Primary Examiner* — Cassandra F Cox
(74) *Attorney, Agent, or Firm* — Birch, Stewart, Kolasch & Birch, LLP

(57) ABSTRACT

A signal generating circuit and a signal generating method are provided. The signal generating circuit includes a first synchronization circuit configured to synchronize a beacon signal and a first signal edge of a clock signal to generate a first synchronization signal; a frequency dividing circuit configured to receive the clock signal and perform frequency division operation on the clock signal to generate a frequency division signal, wherein the duty cycle of the frequency division signal is 50%; a second synchronization circuit configured to receive the first synchronization signal and the frequency division signal and synchronize the first synchronization signal and a second signal edge of frequency division signal to generate a second synchronization signal; and a synthesis circuit configured to receive the second synchronization signal and the frequency division signal and perform AND operation on the second synchronization signal and the frequency division signal to output full-cycle signals.

20 Claims, 13 Drawing Sheets

Receiving first synchronization signal by signal input end of negative edge-triggered D flip flop and receiving frequency division signal by clock input end of negative edge-triggered D flip flop so that negative edge-triggered D flip flop synchronizes first synchronization signal and negative edge of frequency division signal so as to generate second synchronization signal ~S1003 ~S1401

FIG. 15

Receiving first synchronization signal by signal input end of positive edge-triggered D flip flop and receiving frequency division signal by clock input end of positive edge-triggered D flip flop so that positive edge-triggered D flip flop synchronizes first synchronization signal and positive edge of frequency division signal so as to generate second synchronization signal ~S1003 ~S1501

FIG. 16

SIGNAL GENERATING CIRCUIT AND SIGNAL GENERATING METHOD

CROSS-REFERENCE TO RELATED APPLICATION

This non-provisional application claims priority under 35 U.S.C. § 119(a) to Patent Application No. 111127845 filed in Taiwan, R.O.C. on Jul. 25, 2022, the entire contents of which are hereby incorporated by reference.

BACKGROUND

Technical Field

The instant disclosure is related to the field of signal generating circuit, especially related to a technique able to output multiple full-cycle signals within a preset time period.

Related Art

Upon transmitting a test signal, it is usually required that a test signal having multiple full cycles is transmitted within a preset time period, such as a low frequency periodic signaling (LFPS) signal for specifications equal to or higher than USB 3.0. However, when the cycle of the test signal is changed, the existing circuit design often cannot meet the aforementioned requirement, and thus there is a problem of incomplete cycle.

SUMMARY

As above, some embodiments of the instant disclosure provide a signal generating circuit and a signal generating method to improve existing technical problems.

An embodiment of the instant disclosure provides a signal generating circuit for outputting a plurality of full-cycle signals within a signal duration of a beacon signal. The signal generating circuit comprises a first synchronization circuit, a frequency dividing circuit, a second synchronization circuit, and a synthesis circuit. The first synchronization circuit is configured to receive the beacon signal and a clock signal and to synchronize the beacon signal and a first signal edge of the clock signal so as to generate a first synchronization signal; the frequency dividing circuit is configured to receive the clock signal and to perform a frequency division operation on the clock signal so as to generate a frequency division signal, wherein a duty cycle of the frequency division signal is 50%; the second synchronization circuit is configured to receive the first synchronization signal and the frequency division signal and to synchronize the first synchronization signal and a second signal edge of the frequency division signal so as to generate a second synchronization signal; the synthesis circuit is configured to receive the second synchronization signal and the frequency division signal and to perform an AND operation on the second synchronization and the frequency division signal so as to output the full-cycle signals.

An embodiment of the instant disclosure provides a signal generating method for generating a plurality of full-cycle signals within a signal duration of a beacon signal. The signal generating method comprises: synchronizing the beacon signal and a first signal edge of a clock signal by a first synchronization circuit so as to generate a first synchronization signal; performing a frequency division operation on the clock signal by a frequency dividing circuit so as to generate a frequency division signal, wherein a duty cycle of the frequency division signal is 50%; synchronizing the first synchronization signal and a second signal edge of the frequency division signal by a second synchronization circuit so as to generate a second synchronization signal; and performing an AND operation on the second synchronization signal and the frequency division signal by a synthesis circuit so as to output the full-cycle signals.

As above, some embodiments of the instant disclosure provide a signal generating circuit and a signal generating method able to output a plurality of full-cycle signals within a preset period using the synchronization circuits and the frequency dividing circuit.

BRIEF DESCRIPTION OF THE DRAWINGS

The instant disclosure will become more fully understood from the detailed description given herein below for illustration only, and thus not limitative of the instant disclosure, wherein:

FIG. 2-1 illustrates a schematic diagram showing the operation of a first synchronization circuit according to some embodiments of the instant disclosure;

FIG. 2-2 illustrates a schematic diagram showing the operation of a first synchronization circuit according to some embodiments of the instant disclosure;

FIG. 3-1 illustrates a schematic block diagram of a circuit of a frequency dividing circuit according to some embodiments of the instant disclosure;

FIG. 3-2 illustrates a schematic block diagram of a circuit of a frequency dividing circuit according to some embodiments of the instant disclosure;

FIG. 4-1 illustrates a schematic block diagram of a second synchronization circuit according to some embodiments of the instant disclosure;

FIG. 4-2 illustrates a schematic diagram showing the operation of a second synchronization circuit according to some embodiments of the instant disclosure;

FIG. 4-3 illustrates a schematic block diagram of a second synchronization circuit according to some embodiments of the instant disclosure;

FIG. 5-1 illustrates a schematic block diagram of a second synchronization circuit according to some embodiments of the instant disclosure;

FIG. 5-2 illustrates a schematic diagram showing the operation of a second synchronization circuit according to some embodiments of the instant disclosure;

FIG. 15 illustrates a schematic flow chart of a signal generation method according to some embodiments of the instant disclosure; and FIG. 16 illustrates a schematic flow chart of a signal generation method according to some embodiments of the instant disclosure.

DETAILED DESCRIPTION

Figure 1:
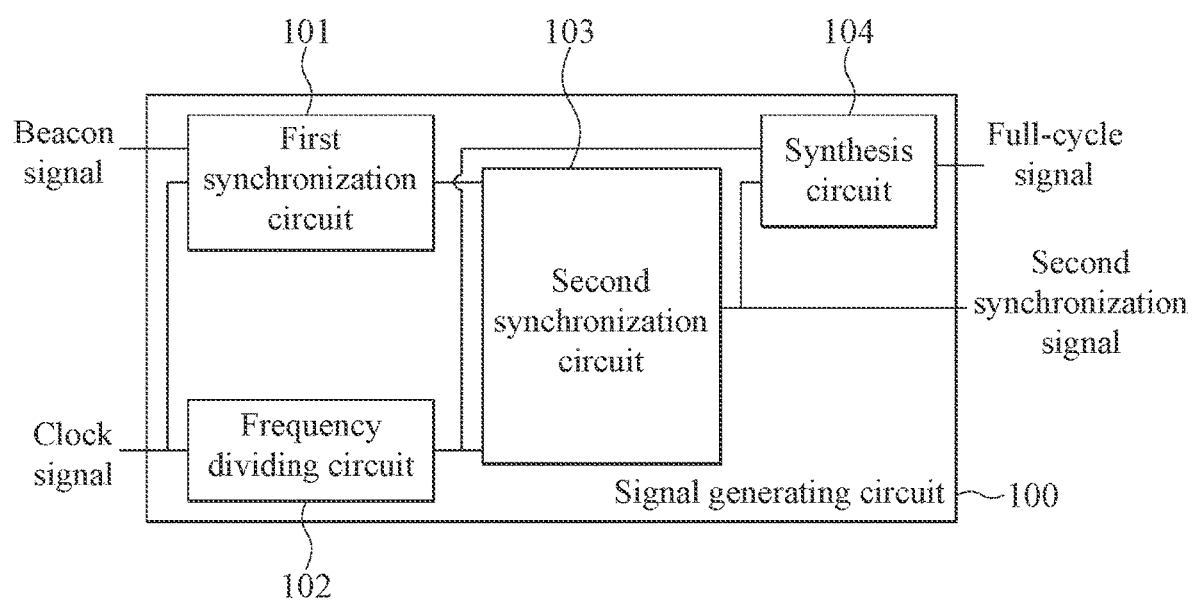
FIG. 1 illustrates a schematic block diagram of a signal generating circuit according to an embodiment of the instant disclosure.

The foregoing and other technical contents, features, and effects of the instant disclosure can be clearly presented below in detailed description with reference to embodiments of the accompanying drawings. Thicknesses or sizes of the elements in the drawings illustrated in an exaggerated, omitted, or general manner are used to help a person skilled in the art to understand and read, and the size of each element is not the completely actual size and is not intended to limit restraint conditions under which the instant disclosure can be implemented and therefore have no technical significance. Any modification to the structure, change to the proportional relationship, or adjustment on the size should fall within the scope of the technical content disclosed by the instant disclosure without affecting the effects and the objectives that can be achieved by the instant disclosure. The same reference numbers are used to refer to the same or similar elements throughout the drawings.

FIG. 1 illustrates a schematic block diagram of a signal generating circuit according to an embodiment of the instant disclosure. Please refer to FIG. 1. The signal generating circuit 100 is for outputting a plurality of full-cycle signals within a signal duration of a beacon signal. The signal generating circuit 100 comprises a first synchronization circuit 101, a frequency dividing circuit 102, a second synchronization circuit 103, and a synthesis circuit 104. The first synchronization circuit 101 is configured to receive the beacon signal and a clock signal, wherein the clock signal is a periodic pulse wave, and the beacon signal is a logical high. The clock signal may be generated by a clock management unit (CMU) external to the signal generating circuit 100 or an oscillator external to the signal generating circuit 100. In a periodic pulse wave, a portion transitioning from a low electrical potential to a high electrical potential is called a positive edge of the periodic pulse wave; a portion transitioning from a high electrical potential to a low electrical potential is called a negative edge of the periodic pulse wave. A signal edge of the periodic pulse wave may refer to a positive edge of the periodic pulse wave or a negative edge of the periodic pulse wave. In a pulse wave, a portion transitioning from a low electrical potential to a high electrical potential is called a positive edge of the pulse wave; a portion transitioning from a high electrical potential to a low electrical potential is called a negative edge of the pulse wave.

The following will illustrate in detail the signal generating method and the cooperation between the modules of the signal generating circuit 100 according to some embodiments of the instant disclosure with the aid of accompanying drawings.

Figure 10:
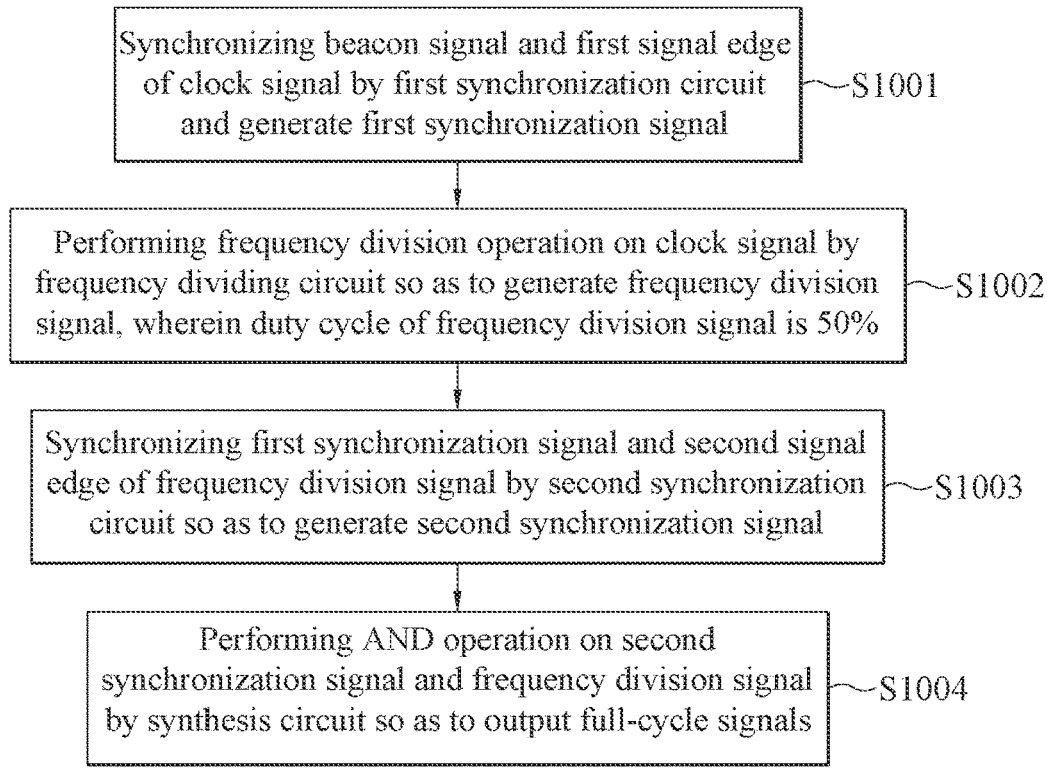
FIG. 10 illustrates a schematic flow chart of a signal generation method according to some embodiments of the instant disclosure.

FIG. 10 illustrates a schematic flow chart of the signal generation method according to some embodiments of the instant disclosure. In the step S1001, when the first synchronization circuit 101 receives the beacon signal, the first synchronization circuit 101 synchronizes the beacon signal and a signal edge (for example, a positive edge) of the clock signal. In this embodiment, the description that "the first synchronization circuit 101 synchronizes the beacon signal and a signal edge (for example, a positive edge) of the clock signal" refers to that the first synchronization circuit 100 generates a first synchronization signal corresponding to the beacon signal based on the beacon signal, so that the starting time of the first synchronization signal is aligned with a signal edge (a positive edge in this example) closest to the starting time of the beacon signal among the signal edges (the positive edges in this example) of the clock signal, and the ending time of the first synchronization signal is aligned with a signal edge (a positive edge in this example) closest to the ending time of the beacon signal among the signal edges (the positive edges in this example) of the clock signal. The following will further illustrate the step S1001 using some embodiments of the instant disclosure.

Figures 1, 2:
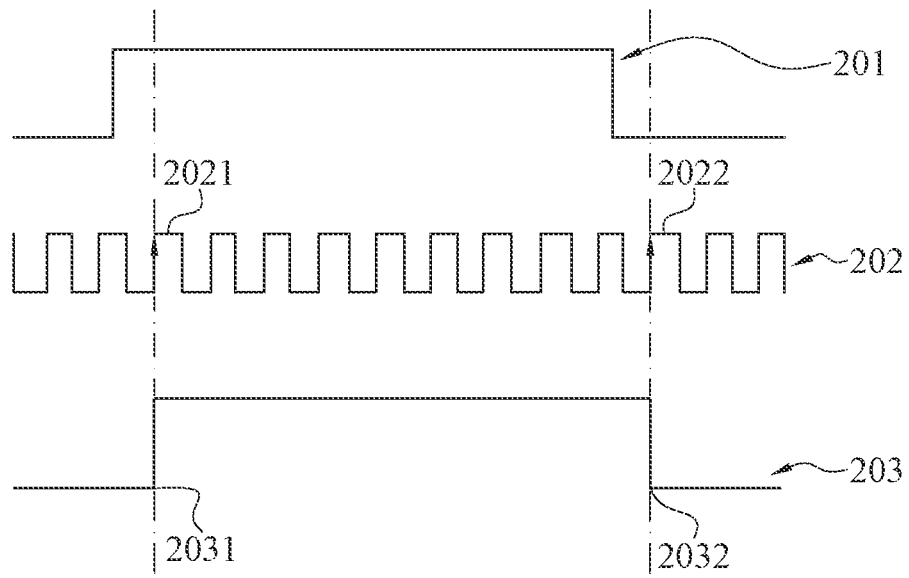
Figure 2:
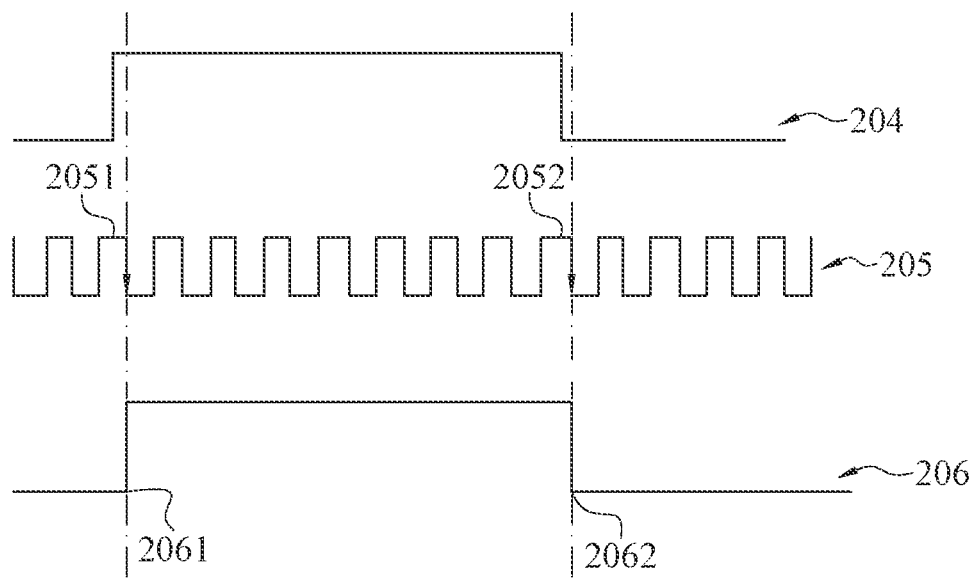
Figure 11:
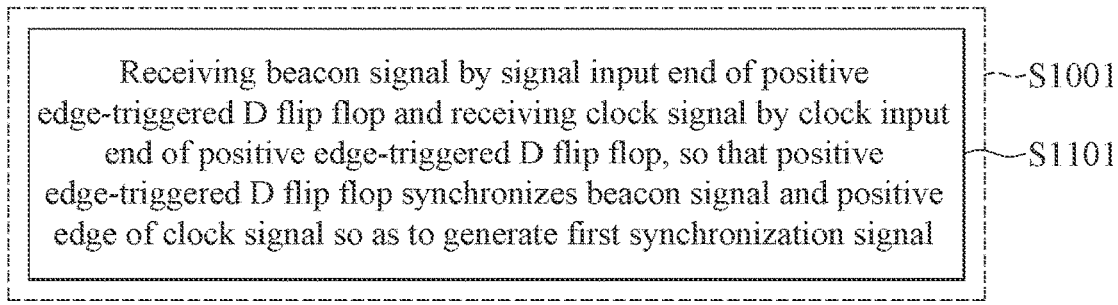
FIG. 11 illustrates a schematic flow chart of a signal generation method according to some embodiments of the instant disclosure.

FIG. 2-1 illustrates a schematic diagram showing the operation of a first synchronization circuit according to some embodiments of the instant disclosure. FIG. 11 illustrates a schematic flow chart of the signal generation method according to some embodiments of the instant disclosure. Please refer to FIG. 1, FIG. 2-1, and FIG. 11 at the same time. In this embodiment, the first synchronization circuit 101 comprises a positive edge-triggered D flip flop, and the step S1001 comprises a step S1101. In the step S1101, the positive edge-triggered D flip flop is configured so that a signal input end of the positive edge-triggered D flip flop receives the beacon signal 201, and a clock input end of the positive edge-triggered D flip flop receives the clock signal 202. Thus, based on the positive-edge triggered characteristic of the positive edge-triggered D flip flop, the positive edge-triggered D flip flop of the first synchronization circuit 101 will generate the first synchronization signal 203 based on the beacon signal 201, the starting time 2031 of the first synchronization signal 203 is aligned with a positive edge closest to the starting time of the beacon signal 201 among the positive edges of the clock signal 202 (the positive edge of the pulse wave 2021), and the ending time 2032 of the first synchronization signal 203 is aligned with a positive edge closest to the ending time of the beacon signal 201 among the positive edges of the clock signal 202 (the positive edge of the pulse wave 2022). In this embodiment, the beacon signal 201 is said to be synchronized to the positive edge of the clock signal 202.

Figure 12:
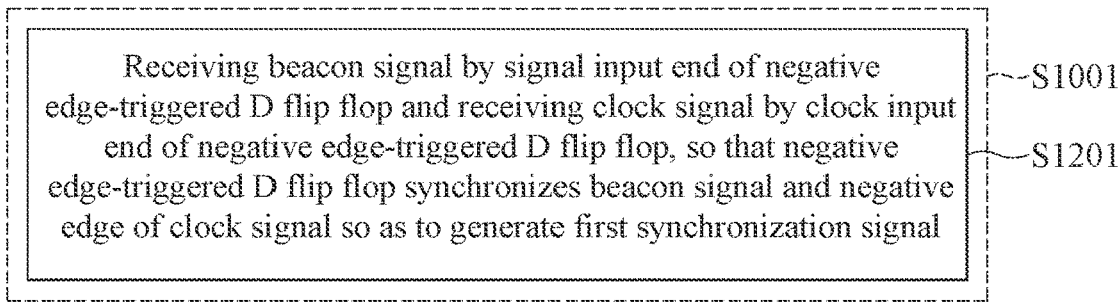
FIG. 12 illustrates a schematic flow chart of a signal generation method according to some embodiments of the instant disclosure.

FIG. 2-2 illustrates a schematic diagram showing the operation of a first synchronization circuit according to some embodiments of the instant disclosure. FIG. 12 illustrates a schematic flow chart of the signal generation method according to some embodiments of the instant disclosure. Please refer to FIG. 1, FIG. 2-1, and FIG. 12 at the same time. In this embodiment, the first synchronization circuit 101 comprises a negative edge-triggered D flip flop, and the step S1001 comprises a step S1201. In the step S1201, the negative edge-triggered D flip flop is configured so that the signal input end of the negative edge-triggered D flip flop receives the beacon signal 204, and the clock input end of the negative edge-triggered D flip flop receives the clock signal 205. Thus, based on the negative-edge triggered characteristic of the negative edge-triggered D flip flop, the first synchronization circuit 101 will generate the first synchronization signal 206 based on the beacon signal 204, the starting time 2061 of the first synchronization signal 206 is aligned with a negative edge closest to the starting time of the beacon signal 204 among the negative edges of the clock signal 205 (the negative edge of the pulse wave 2051), and the ending time 2062 of the first synchronization signal 206 is aligned with a negative edge closest to the ending time of the beacon signal 204 among the negative edges of the clock signal 205 (the negative edge of the pulse wave 2052). In this embodiment, the beacon signal 204 is said to be synchronized to the negative edge of the clock signal 205.

Please refer to FIG. 1 and FIG. 10. In the step S1002, the frequency dividing circuit 102 receives the clock signal and performs a frequency division operation on the clock signal to generate a frequency division signal, wherein the duty cycle of the frequency division signal is 50%. The following will further illustrate the step S1002 using some embodiments of the instant disclosure.

Figures 1, 3:
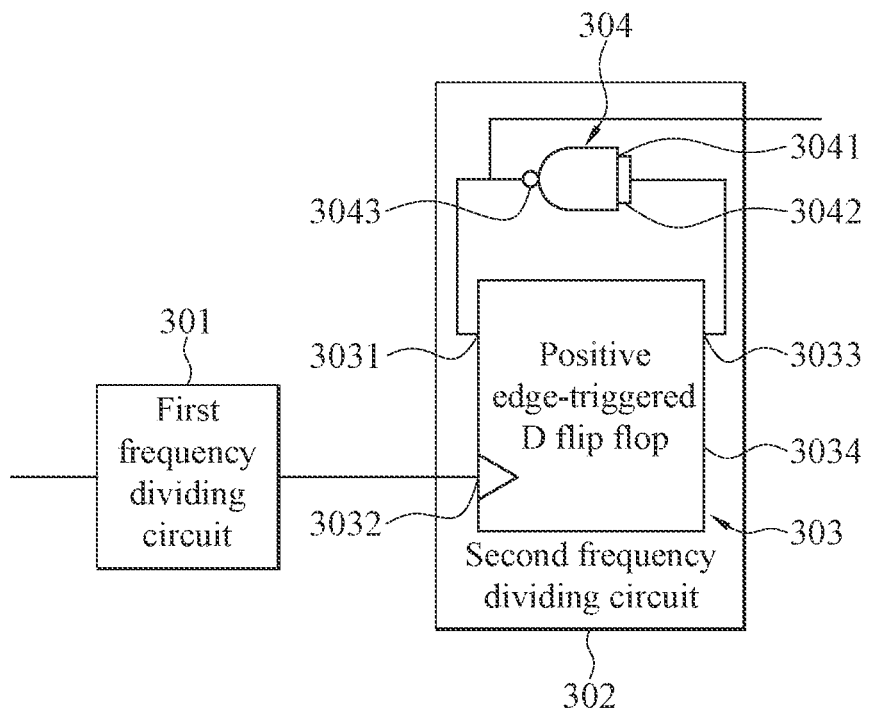
Figures 2, 3:
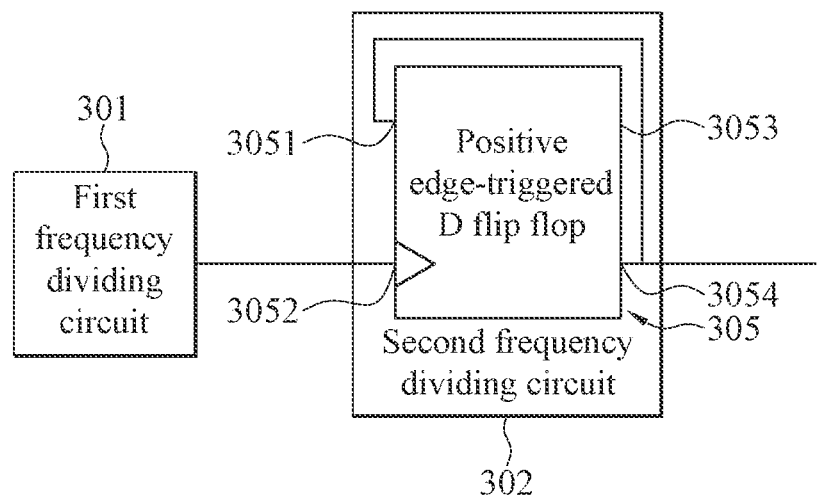
Figure 13:
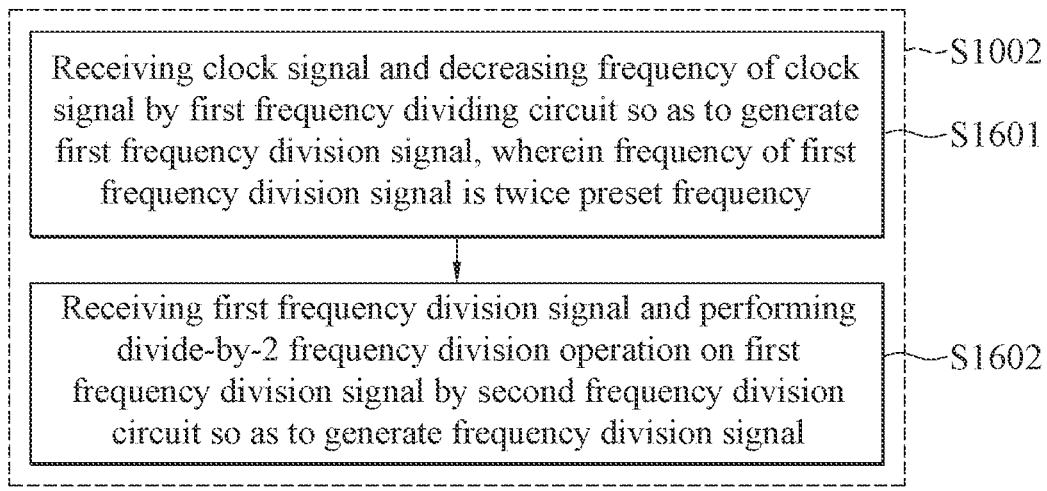
FIG. 13 illustrates a schematic flow chart of a signal generation method according to some embodiments of the instant disclosure.

FIG. 3-1 and FIG. 3-2 illustrate schematic block diagrams of the circuits of a frequency dividing circuit according to some embodiments of the instant disclosure. FIG. 13 illustrates a schematic flow chart of a signal generation method according to some embodiments of the instant disclosure. Please refer to FIG. 3-1, FIG. 3-2, and FIG. 13 at the same time. The frequency dividing circuit 102 comprises a first frequency dividing circuit 301 and a second frequency dividing circuit 302. The first frequency dividing circuit 301 is a frequency divider. The first frequency dividing circuit 301 is configured to receive the clock signal and decrease the frequency of the clock signal so as to generate a first frequency division signal, wherein the frequency of the first frequency division signal is twice a preset frequency. The second frequency dividing circuit 302 is a divide-by-2 frequency divider. The second frequency dividing circuit 302 is configured to receive the first frequency division signal and perform a divide-by-2 frequency division operation on the first frequency division signal so as to generate the frequency division signal. The step S1002 comprises a step S1601 and a step S1602. In the step S1601, the first frequency dividing circuit 301 receives the clock signal and decreases the frequency of the clock signal to generate the first frequency division signal, wherein, as previously illustrated, the frequency of the first frequency division signal is twice the preset frequency. In the step S1602, the second frequency dividing circuit 302 receives the first frequency division signal and performs the divide-by-2 frequency division operation on the first frequency division signal to generate the frequency division signal.

Please refer to FIG. 3-1. In the embodiment shown in FIG. 3-1, the second frequency dividing circuit 302 comprises a positive edge-triggered D flip flop 303 and a NAND gate 304. A clock input end 3032 of the positive edge-triggered D flip flop 303 is configured to receive the first frequency division signal. Input ends 3041, 3042 of the NAND gate 304 are configured to simultaneously receive an output of the positive edge-triggered D flip flop 303. The signal input end 3031 of the positive edge-triggered D flip flop 303 is configured to receive the output of an output end 3043 of the NAND gate 304. The output signal of the complementary output end 3034 of the positive edge-triggered D flip flop 303 is not used in this embodiment. The output signal of the output end 3043 of the NAND gate 304 serves as the frequency division signal. It is worth mentioning that, in the embodiment shown in FIG. 3-1, the configuration of the second frequency dividing circuit 302 makes the duty cycle of the output signal of the output end 3043 of the NAND gate 304 be 50%, and thus the duty cycle of the frequency division signal is also 50%.

Please refer to FIG. 3-2. In the embodiment shown in FIG. 3-2, the second frequency dividing circuit 302 comprises a positive edge-triggered D flip flop 305. The signal input end 3052 of the positive edge-triggered D flip flop 305 is configured to receive the first frequency division signal. The signal input end 3051 of the positive edge-triggered D flip flop 305 is configured to receive the output signal of a complementary output end 3054 of the positive edge-triggered D flip flop 305. The output signal of the output end 3053 of the positive edge-triggered D flip flop 305 is not used in this embodiment. The output signal of the complementary output end 3054 of the positive edge-triggered D flip flop 305 serves as the frequency division signal. It is worth mentioning that, in the embodiment shown in FIG. 3-2, the configuration of the second frequency dividing circuit 302 makes the duty cycle of the output signal of the complementary output end 3054 of the positive edge-triggered D flip flop 305 be 50%, and thus the duty cycle of the frequency division signal is also 50%.

Please refer to FIG. 1 and FIG. 10. The second synchronization circuit 103 is configured to receive the first synchronization signal and the frequency division signal. In the step S1003, the second synchronization circuit 103 synchronizes the first synchronization signal and the second signal edge of the frequency division signal to generate the second synchronization signal. The following will further illustrate the step S1003 using some embodiments of the instant disclosure.

Figures 1, 4:
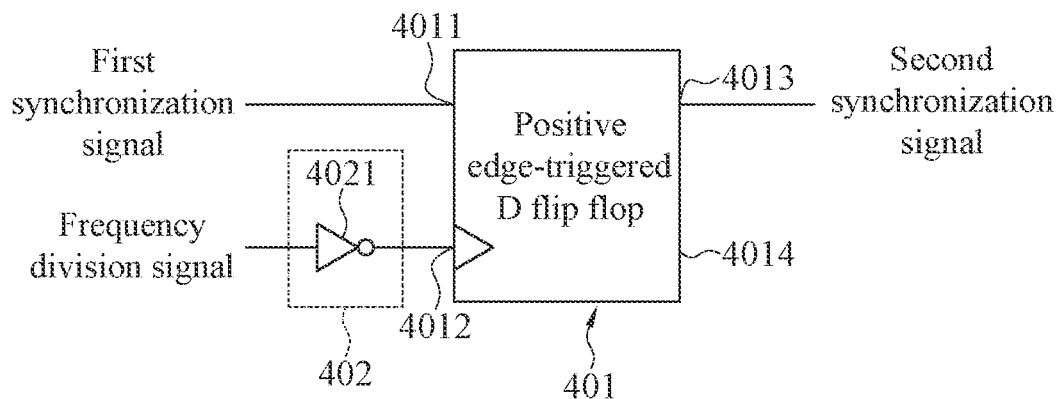
Figures 2, 4:
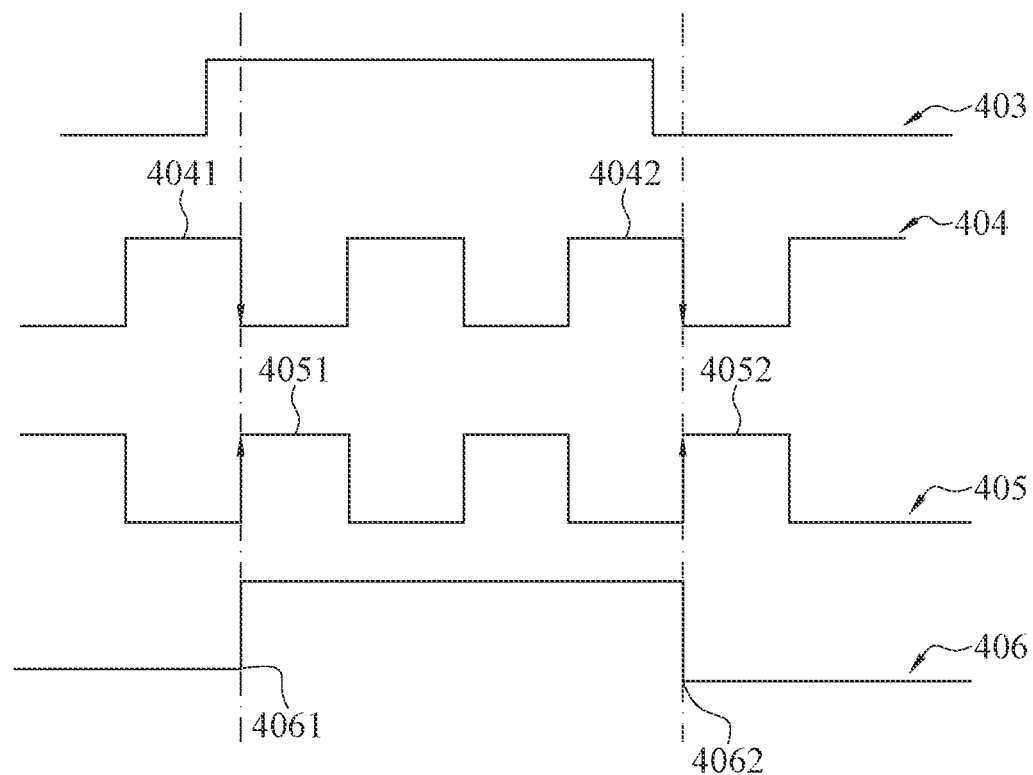
Figures 3, 4:
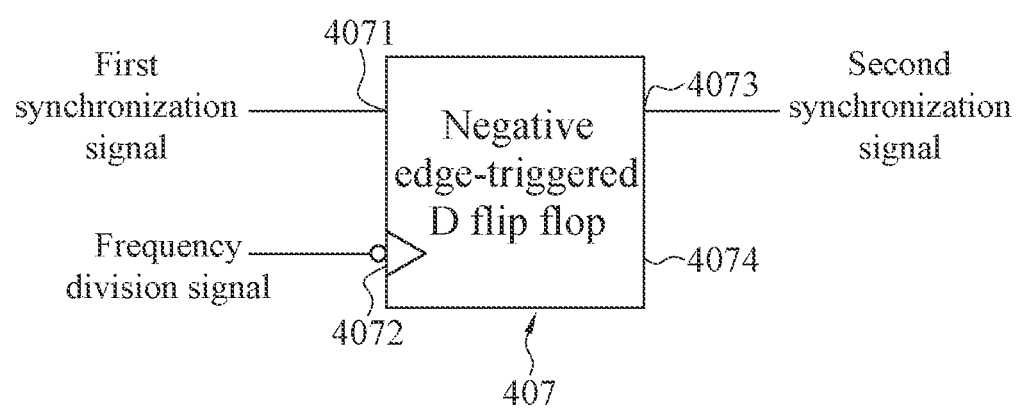
Figure 14:
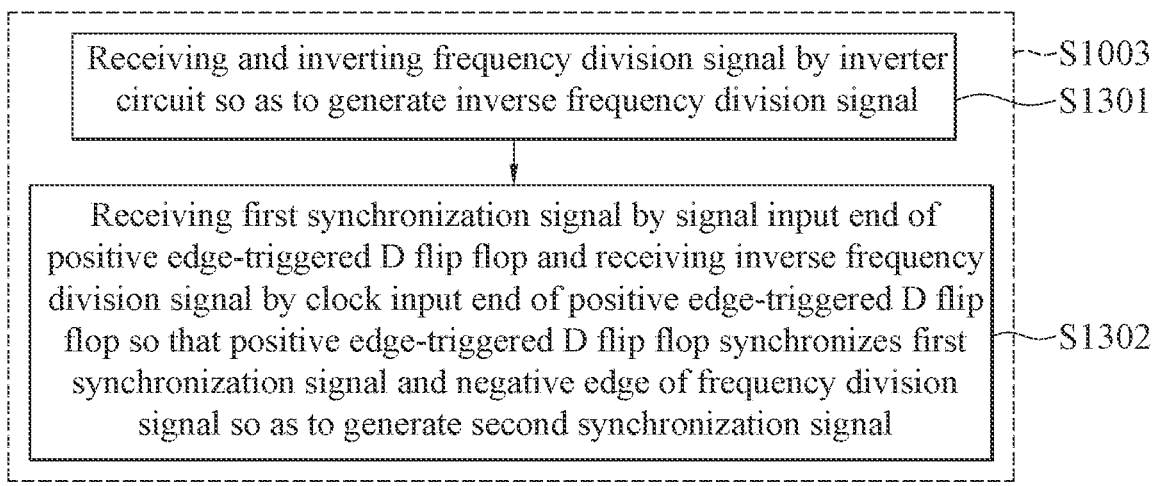
FIG. 14 illustrates a schematic flow chart of a signal generation method according to some embodiments of the instant disclosure.

FIG. 4-1 illustrates a schematic block diagram of a second synchronization circuit according to some embodiments of the instant disclosure. FIG. 4-2 illustrates a schematic diagram showing the operation of a second synchronization circuit according to some embodiments of the instant disclosure. FIG. 14 illustrates a schematic flow chart of the signal generation method according to some embodiments of the instant disclosure. Please refer to FIG. 4-1, FIG. 4-2, and FIG. 14 at the same time. In this embodiment, the second signal edge of the frequency division signal is the negative edge of the frequency division signal. In other words, the second synchronization circuit 103 synchronizes the first synchronization signal to the negative edge of the frequency division signal in this embodiment.

As shown in FIG. 4-1 and FIG. 4-2, the second synchronization circuit 103 comprises a positive edge-triggered D flip flop 401 and an inverter circuit 402, wherein the inverter circuit 402 comprises an inverter 4021. The step S1003 comprises a step S1301 and a step S1302. In the step S1301, the inverter 4021 receives and inverts the frequency division signal 404 so as to generate an inverse frequency division signal 405. In the step S1302, the signal input end 4011 of the positive edge-triggered D flip flop 401 receives the first synchronization signal 403, and the clock input end 4012 of the positive edge-triggered D flip flop 401 receives the inverse frequency division signal 405. Thus, based on the positive edge-triggered characteristic of the positive edge-triggered D flip flop, the first synchronization signal 403 is synchronized to the positive edge of the inverse frequency division signal 405, and the output end 4013 of the positive edge-triggered D flip flop 401 generates the second synchronization signal 406. The complementary output end 4014 of the positive edge-triggered D flip flop 401 is not used in this embodiment. That is, in this embodiment, the starting time 4061 of the second synchronization signal 406 is aligned with a positive edge closest to the starting time of the first synchronization signal 403 among the positive edges of the inverse frequency division signal 405 (the positive edge of the pulse wave 4051), and the ending time 4062 of the second synchronization signal 604 is aligned with a positive edge closest to the ending time of the first synchronization signal 403 among the positive edges of the inverse frequency division signal 405 (the positive edge of the pulse wave 4052).

Because the inverse frequency division signal 405 is the inverse signal of the frequency division signal 404, the first synchronization signal 403 is synchronized to the negative edge of the frequency division signal 404. That is, in this embodiment, as shown in FIG. 4-2, the starting time 4061 of the second synchronization signal 406 is aligned with a negative edge closest to the starting time of the first synchronization signal 403 among the negative edges of the frequency division signal 404 (the negative edge of the pulse wave 4041), and the ending time 4062 of the second synchronization signal 406 is aligned with a negative edge closest to the ending time of the first synchronization signal 403 among the negative edges of the frequency division signal 404 (the negative edge of the pulse wave 4042).

FIG. 4-3 illustrates a schematic block diagram of a second synchronization circuit according to some embodiments of the instant disclosure. FIG. 15 illustrates a schematic flow chart of the signal generation method according to some embodiments of the instant disclosure. Please refer to FIG. 4-2, FIG. 4-3, and FIG. 15 at the same time. In this embodiment, the second signal edge of the frequency division signal is the negative edge of the frequency division signal. In other words, the second synchronization circuit 103 synchronizes the first synchronization signal to the negative edge of the frequency division signal in this embodiment.

As shown in FIG. 4-3, the second synchronization circuit 103 comprises a negative edge-triggered D flip flop 407. The step S1003 comprises a step S1401. In the step S1401, the signal input end 4071 of the negative edge-triggered D flip flop 407 receives the first synchronization signal 403, and the clock input end 4072 of the negative edge-triggered D flip flop 407 receives the frequency division signal 404. Thus, based on the negative edge-triggered characteristic of the negative edge-triggered D flip flop 407, the first synchronization signal 403 is synchronized to the negative edge of the frequency division signal 404, and the output end 4073 of the negative edge-triggered D flip flop 407 generates the second synchronization signal 406. The complementary output end 4074 of the negative edge-triggered D flip flop 407 is not used in this embodiment.

Figures 1, 5:
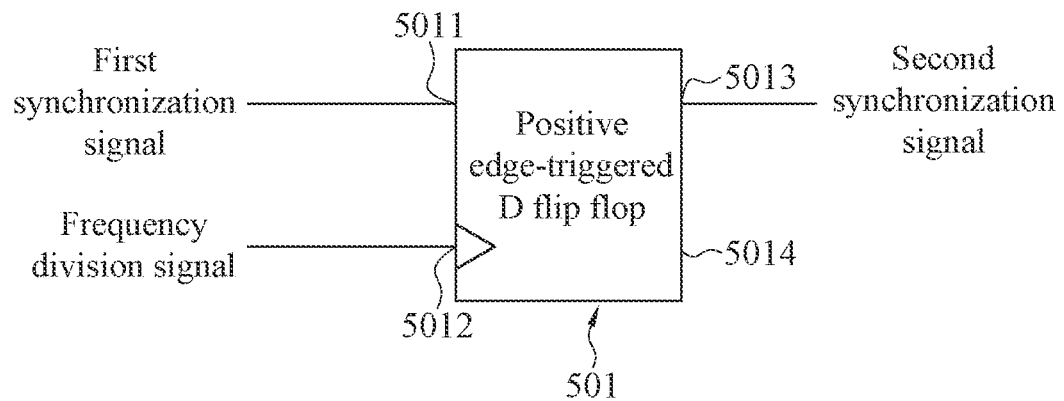
Figures 2, 5:
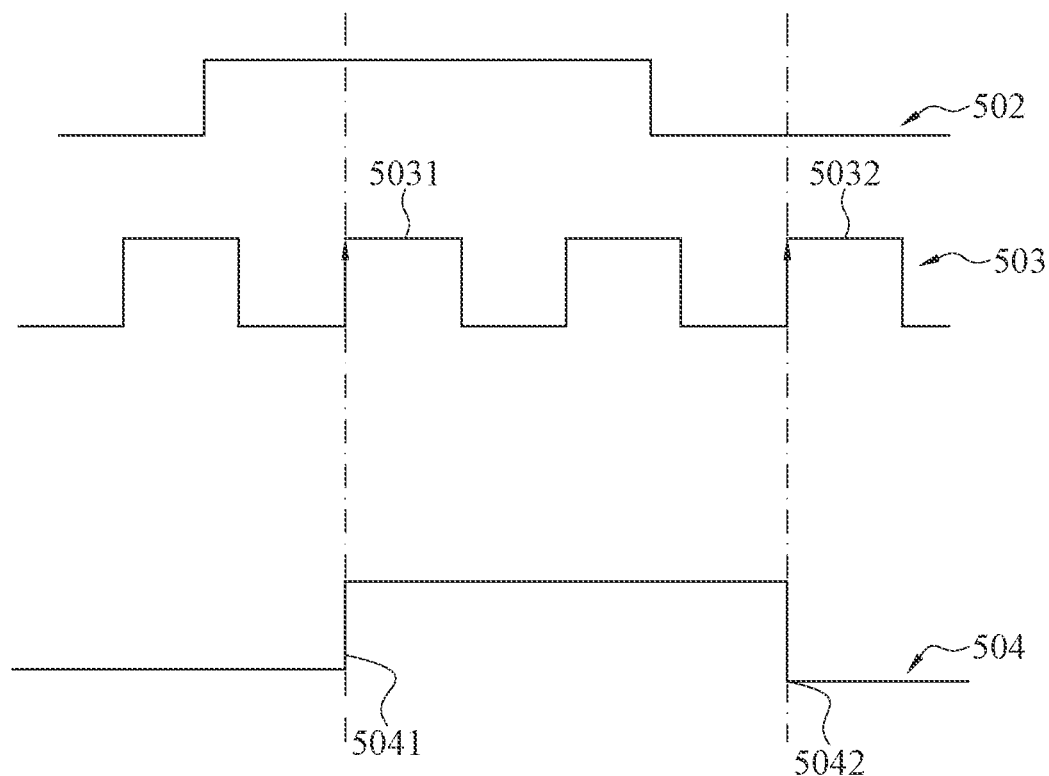

FIG. 5-1 illustrates a schematic block diagram of a second synchronization circuit according to some embodiments of the instant disclosure. FIG. 5-2 illustrates a schematic view showing the operation of a second synchronization circuit according to some embodiments of the instant disclosure. FIG. 16 illustrates a schematic flow chart of the signal generation method according to some embodiments of the instant disclosure. Please refer to FIG. 5-1, FIG. 5-2, and FIG. 16 at the same time. In this embodiment, the second signal edge of the frequency division signal is the positive edge of the frequency division signal. In other words, the second synchronization circuit 103 synchronizes the first synchronization signal to the positive edge of the frequency division signal in this embodiment.

As shown in FIG. 5-1, the second synchronization circuit 103 comprises a positive edge-triggered D flip flop 501. The step S1003 comprises a step S1501. In the step S1501, the signal input end 5011 of the positive edge-triggered D flip flop 501 receives the first synchronization signal 502, and the clock input end 5012 of the positive edge-triggered D flip flop 501 receives the frequency division signal 503. Thus, based on the positive edge-triggered characteristic of the positive edge-triggered D flip flop 501, the first synchronization signal 502 is synchronized to the positive edge of the frequency division signal 503, and the output end 5013 of the positive edge-triggered D flip flop 501 generates the second synchronization signal 504. That is, in this embodiment, the starting time 5041 of the second synchronization signal 504 is aligned with a positive edge closest to the starting time of the first synchronization signal 502 among the positive edges of the frequency division signal 503 (the positive edge of the pulse wave 5031), and the ending time 5042 of the second synchronization signal 504 is aligned with a positive edge closest to the ending time of the first synchronization signal 502 among the positive edges of the frequency division signal 503 (the positive edge of the pulse wave 5032). The complementary output end 5014 of the positive edge-triggered D flip flop 501 is not used in this embodiment.

Please refer to FIG. 1 and FIG. 10. In the step S1004, the synthesis circuit 104 receives the second synchronization signal and the frequency division signal, and the synthesis circuit 104 performs an AND operation on the second synchronization signal and the frequency division signal to output the full-cycle signal. In some embodiments of the instant disclosure, the synthesis circuit 104 comprises an AND gate, and the AND gate performs the AND operation on the second synchronization signal and the frequency division signal to output the full-cycle signal. It is worth mentioning that, performing the AND operation on the second synchronization signal and the frequency division signal by the AND gate can avoid the problem of timing skew of the outputted full-cycle signal.

Figure 6:
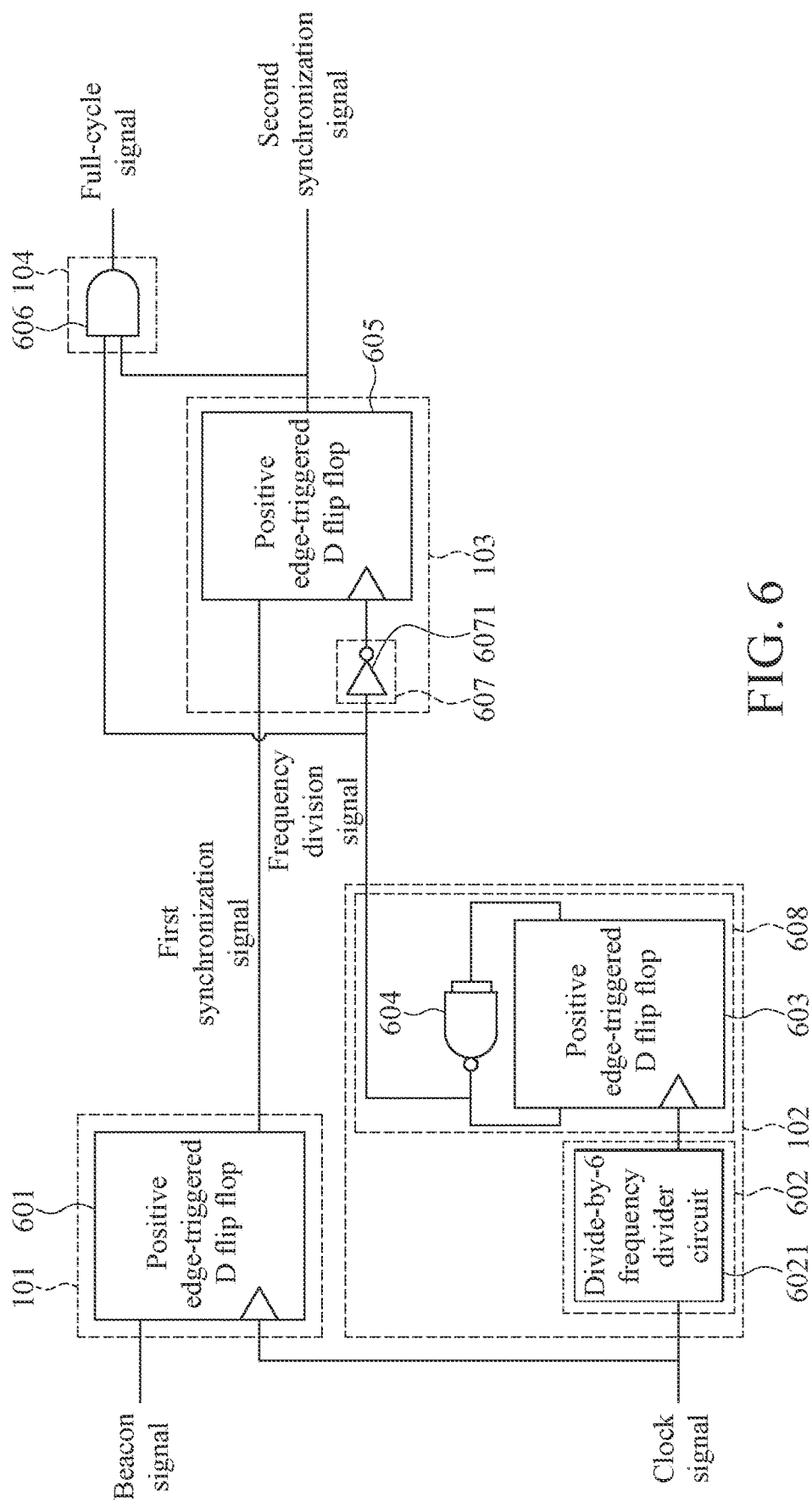
FIG. 6 illustrates a schematic block diagram of a signal generating circuit according to some embodiments of the instant disclosure.
Figure 7:
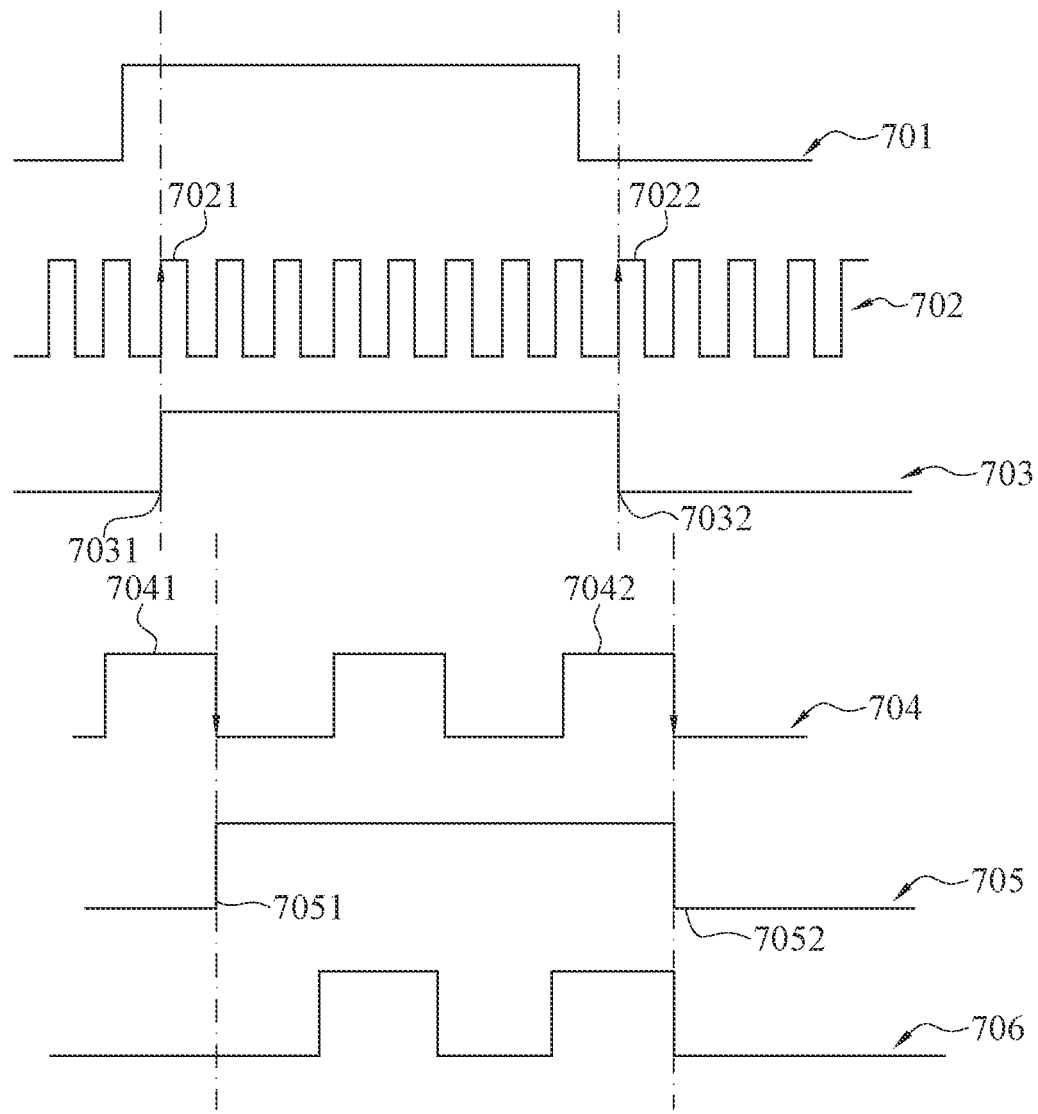
FIG. 7 illustrates a schematic diagram showing the operation of a signal generating circuit according to some embodiments of the instant disclosure.

FIG. 6 illustrates a schematic block diagram of a signal generating circuit according to some embodiments of the instant disclosure. FIG. 7 illustrates a schematic view showing the operation of a signal generating circuit according to some embodiments of the instant disclosure. Please refer to FIG. 1, FIG. 6, FIG. 7, and FIG. 10 at the same time. In this embodiment, the signal generating circuit 100 is applied to generate a low frequency periodic signaling (LFPS) signal for specifications equal to or higher than USB 3.0. The signal duration of the beacon signal 701 is 100 ns (nanosecond), and the clock signal 702 is a periodic pulse wave with 250 MHz (megahertz) frequency and 4 ns cycle. The requirement of the circuit specification is that two full-cycle signals are outputted within the signal duration of the beacon signal 701, and the cycle of each of the full-cycle signal is 48 ns. Because the cycle of the frequency division signal is identical to the cycle of the full-cycle signal, 12 is selected to be the divisor of the frequency dividing circuit 102. Under this configuration, the cycle of the frequency division is 48 ns, and the product of the cycle of the frequency division signal and the number of the full-cycle signals is: 48*2=96, which is less than the signal duration of the beacon signal 701, 100 ns. Therefore, the first frequency dividing circuit 602 of the frequency dividing circuit 102 is configured to comprise a divide-by-6 frequency dividing circuit 6021, and the second frequency dividing circuit 608 of the frequency dividing circuit 102 is configured to comprise a divide-by-2 divider having a positive edge-triggered D flip flop 603 and a NAND gate 604.

As shown in FIG. 6, in this embodiment, the first synchronization circuit 101 comprises a positive edge-triggered D flip flop 601. The second synchronization circuit 103 comprises a positive edge-triggered D flip flop 605 and an inverter circuit 607, wherein the inverter circuit 607 comprises an inverter 6071. The synthesis circuit 104 comprises an AND gate 606.

In the step S1001, the positive edge-triggered D flip flop 601 generates the first synchronization signal 703 based on the beacon signal 701, so that the starting time 7031 of the first synchronization signal 703 is aligned with a positive edge closest to the starting time of the beacon signal 701 among the positive edges of the clock signal 702 (the positive edge of the pulse wave 7021), and the ending time 7032 of the first synchronization signal 703 is aligned with a positive edge closest to the ending time of the beacon signal 701 among the positive edges of the clock signal 702 (the positive edge of the pulse wave 7022).

In the step S1002, the frequency dividing circuit 102 receives the clock signal 702 and performs the frequency division operation on the clock signal 702 to generate the frequency division signal 704, wherein the duty cycle of the frequency division signal 704 is 50%.

In the step S1003, the inverter 6071 receives and inverts the frequency division signal 704 so as to generate an inverse frequency division signal. The signal input end of the positive edge-triggered D flip flop 605 receives the first synchronization signal 703, and the clock input end of the positive edge-triggered D flip flop 605 receives the inverse frequency division signal. Thus, based on the positive edge-triggered characteristic of the positive edge-triggered D flip flop 605, the first synchronization signal 703 is synchronized to the positive edge of the inverse frequency division signal, and the output end of the positive edge-triggered D flip flop 605 generates the second synchronization signal 705. Because the inverse frequency division signal is the inverse signal of the frequency division signal 704, the first synchronization signal 703 is synchronized to the negative edge of the frequency division signal 704. That is, in this embodiment, as shown in FIG. 7, the starting time 7051 of the second synchronization signal 705 is aligned with a negative edge closest to the starting time 7031 of the first synchronization signal 703 among the negative edges of the frequency division signal 704 (the negative edge of the pulse wave 7041), and the ending time 7052 of the second synchronization signal 705 is aligned with a negative edge closest to the ending time 7032 of the first synchronization signal 703 among the negative edges of the frequency division signal 704 (the negative edge of the pulse wave 7042).

In the step S1004, the AND gate 606 of the synthesis circuit 104 receives the second synchronization signal 705 and the frequency division signal 704. The AND gate 606 of the synthesis circuit 104 also performs the AND operation on the second synchronization signal 705 and the frequency division signal 704 to output the full-cycle signals 706.

Figure 8:
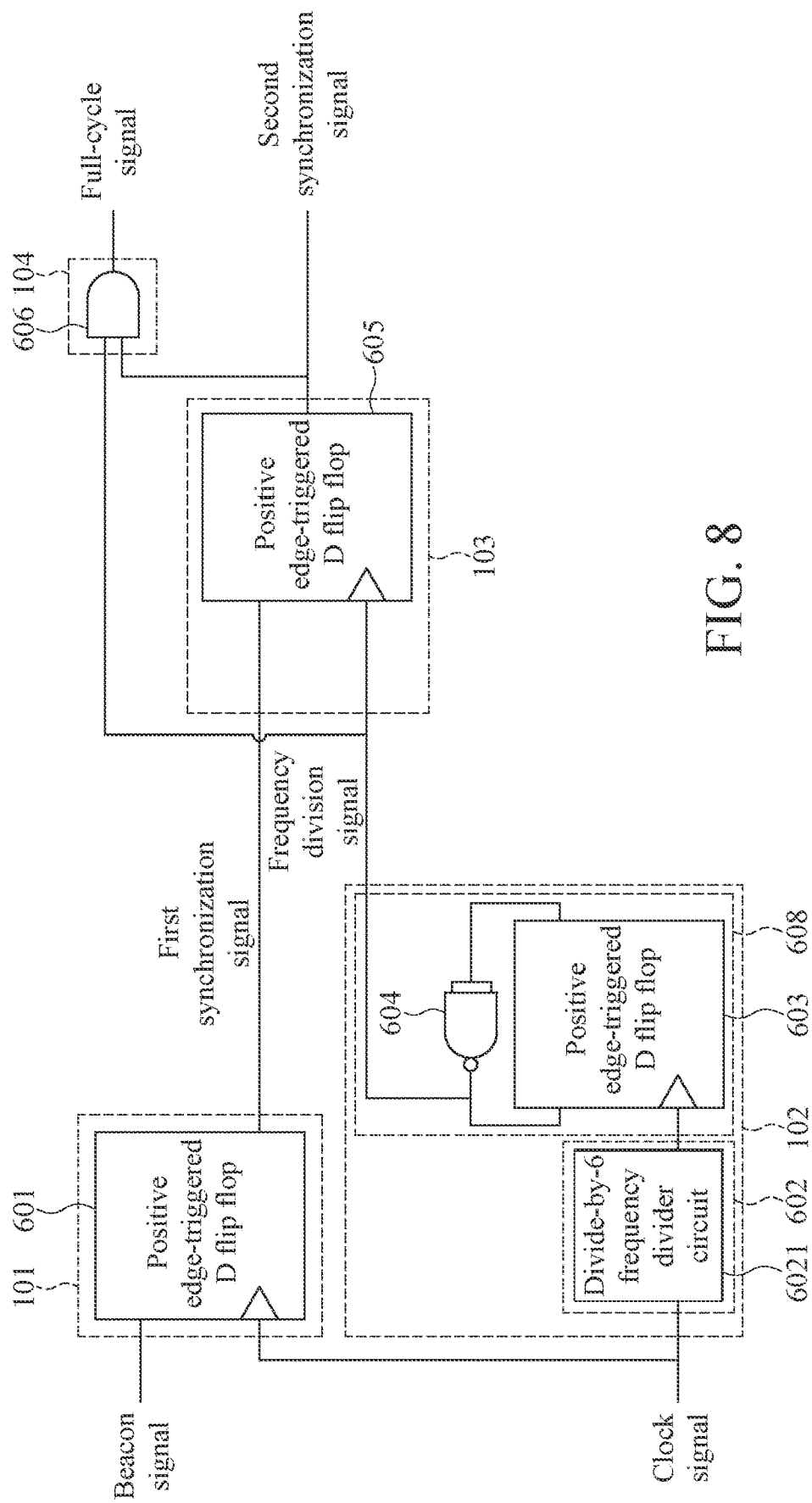
FIG. 8 illustrates a schematic block diagram of a signal generating circuit according to some embodiments of the instant disclosure.
Figure 9:
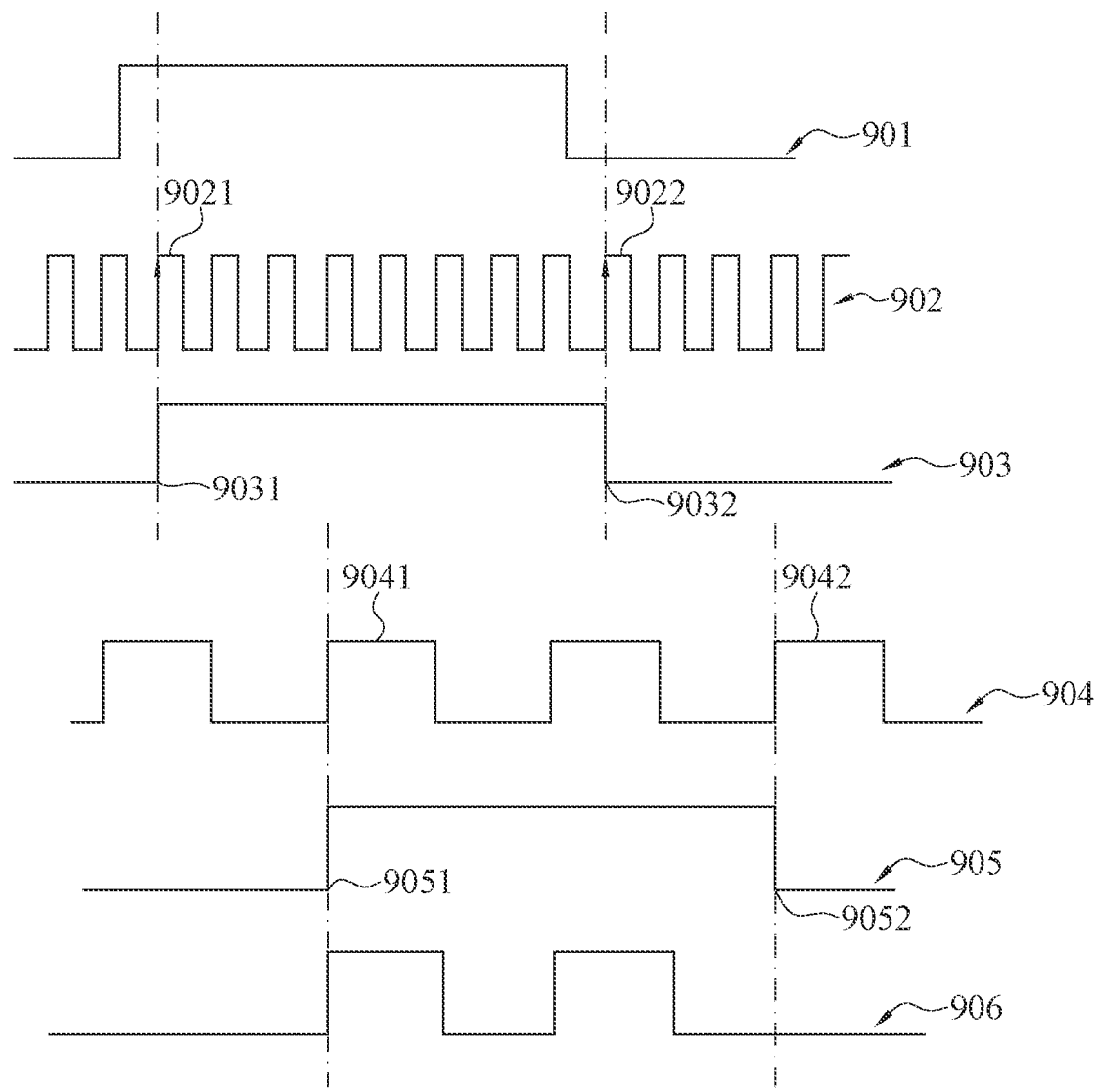
FIG. 9 illustrates a schematic diagram showing the operation of a signal generating circuit according to some embodiments of the instant disclosure.

FIG. 8 illustrates a schematic block diagram of a signal generating circuit according to some embodiments of the instant disclosure. FIG. 9 illustrates a schematic diagram showing the operation of the signal generating circuit 100 according to some embodiments of the instant disclosure. Please refer to FIG. 1, FIG. 8, FIG. 9, and FIG. 10 at the same time. In this embodiment, the signal duration of the beacon signal 901 is 100 ns, and the clock signal 902 is a periodic pulse wave with 250 MHz frequency and 4 ns cycle. The requirement of the circuit specification is that two full-cycle signals are outputted within the signal duration of the beacon signal 901, and the cycle of each of the full-cycle signal is 48 ns. Because the cycle of the frequency division signal is identical to the cycle of the full-cycle signal, 12 is selected to be the divisor of the frequency dividing circuit 102. Under this configuration, the cycle of the frequency division is 48 ns, and the product of the cycle of the frequency division signal and the number of the full-cycle signals is: 48*2=96, which is less than the signal duration of the beacon signal 901, 100 ns. Therefore, the first frequency dividing circuit 602 of the frequency dividing circuit 102 is configured to comprise a divide-by-6 frequency dividing circuit 6021, and the second frequency dividing circuit 608 of the frequency dividing circuit 102 is configured to comprise a divide-by-2 divider having a positive edge-triggered D flip flop 603 and a NAND gate 604.

As shown in FIG. 8, the first synchronization circuit 101 comprises a positive edge-triggered D flip flop 601. The second synchronization circuit 103 comprises a positive edge-triggered D flip flop 605. The synthesis circuit 104 comprises an AND gate 606.

In the step S1001, the positive edge-triggered D flip flop 601 generates the first synchronization signal 903 based on the beacon signal 901, so that the starting time 9031 of the first synchronization signal 903 is aligned with a positive edge closest to the starting time of the beacon signal 901 among the positive edges of the clock signal 902 (the positive edge of the pulse wave 9021), and the ending time 9032 of the first synchronization signal 903 is aligned with a positive edge closest to the ending time of the beacon signal 901 among the positive edges of the clock signal 902 (the positive edge of the pulse wave 9022).

In the step S1002, the frequency dividing circuit 102 receives the clock signal 902 and performs the frequency division operation on the clock signal 902 to generate the frequency division signal 904, wherein the duty cycle of the frequency division signal 904 is 50%.

In the step S1003, the signal input end of the positive edge-triggered D flip flop 605 receives the first synchronization signal 903, and the clock input end of the positive edge-triggered D flip flop 605 receives the frequency division signal. Thus, based on the positive edge-triggered characteristic of the positive edge-triggered D flip flop 605, the first synchronization signal 903 is synchronized to the positive edge of the frequency division signal 904, and the output end of the positive edge-triggered D flip flop 605 generates the second synchronization signal 905. That is, in this embodiment, as shown in FIG. 9, the starting time 9051 of the second synchronization signal 905 is aligned with a positive edge closest to the starting time 9031 of the first synchronization signal 903 among the positive edges of the frequency division signal 904 (the positive edge of the pulse wave 9041), and the ending time 9052 of the second synchronization signal 905 is aligned with a positive edge closest to the ending time 9032 of the first synchronization signal 903 among the positive edges of the frequency division signal 904 (the positive edge of the pulse wave 9042).

In the step S1004, the AND gate 606 of the synthesis circuit 104 receives the second synchronization signal 905 and the frequency division signal 904. The AND gate 606 of the synthesis circuit 104 also performs the AND operation on the second synchronization signal 905 and the frequency division signal 904 to output the full-cycle signals 906.

As above, some embodiments of the instant disclosure provide a signal generating circuit and a signal generating method able to output the full-cycle signals within a preset period using synchronization circuits and a frequency dividing circuit.

Although the technical context of the instant disclosure has been disclosed using the exemplary embodiments above, the exemplary embodiments are not meant to limit the instant disclosure. Any alteration and retouch made by persons skilled in the art without deviating from the spirit of the instant disclosure shall fall into the scope of the instant disclosure. The scope of protected invention shall be defined by the claims below.

What is claimed is:

1. A signal generating circuit configured for outputting a plurality of full-cycle signals within a signal duration of a beacon signal, the signal generating circuit comprising:
    a first synchronization circuit configured to receive the beacon signal and a clock signal and to synchronize the beacon signal and a first signal edge of the clock signal so as to generate a first synchronization signal;
    a frequency dividing circuit configured to receive the clock signal and to perform a frequency division operation on the clock signal and generate a frequency division signal;
    a second synchronization circuit configured to receive the first synchronization signal and the frequency division signal and to synchronize the first synchronization signal and a second signal edge of the frequency division signal so as to generate a second synchronization signal; and
    a synthesis circuit configured to receive the second synchronization signal and the frequency division signal and to perform an AND operation on the second synchronization and the frequency division signal so as to output the full-cycle signals.

2. The signal generating circuit according to claim 1, wherein a divisor of the frequency dividing circuit is configured so that a product of a cycle of the frequency division signal and a number of the full-cycle signals is less than or equal to the signal duration, and a duty cycle of the frequency division signal is 50%.

3. The signal generating circuit according to claim 1, wherein the first signal edge of the clock signal is a positive edge of the clock signal, and the first synchronization circuit comprises a positive edge-triggered D flip flop; a signal input end of the positive edge-triggered D flip flop is configured to receive the beacon signal, and a clock input end of the positive edge-triggered D flip flop is configured to receive the clock signal, so that the positive edge-triggered D flip flop synchronizes the beacon signal and the positive edge of the clock signal so as to generate the first synchronization signal.

4. The signal generating circuit according to claim 1, wherein the first signal edge of the clock signal is a negative edge of the clock signal, and the first synchronization circuit comprises a negative edge-triggered D flip flop; a signal input end of the negative edge-triggered D flip flop is configured to receive the beacon signal, and a clock input end of the negative edge-triggered D flip flop is configured to receive the clock signal, so that the negative edge-triggered D flip flop synchronizes the beacon signal and the negative edge of the clock signal so as to generate the first synchronization signal.

5. The signal generating circuit according to claim 1, wherein the second signal edge of the frequency division signal is a negative edge of the frequency division signal, and the second synchronization circuit comprises:
    a positive edge-triggered D flip flop; and
    an inverter circuit;
    wherein the inverter circuit is configured to receive and invert the frequency division signal so as to generate an inverse frequency division signal, a signal input end of the positive edge-triggered D flip flop is configured to receive the first synchronization signal, and a clock input end of the positive edge-triggered D flip flop is configured to receive the inverse frequency division signal, so that the positive edge-triggered D flip flop synchronizes the first synchronization signal and the negative edge of the frequency division signal so as to generate the second synchronization signal.

6. The signal generating circuit according to claim 1, wherein the second signal edge of the frequency division signal is a negative edge of the frequency division signal, and the second synchronization circuit comprises a negative edge-triggered D flip flop; a signal input end of the negative edge-triggered D flip flop is configured to receive the first synchronization signal, and a clock input end of the negative edge-triggered D flip flop is configured to receive the frequency division signal, so that the negative edge-triggered D flip flop synchronizes the first synchronization signal and the negative edge of the frequency division signal so as to generate the second synchronization signal.

7. The signal generating circuit according to claim 1, wherein the second signal edge of the frequency division signal is a positive edge of the frequency division signal, and the second synchronization circuit comprises a positive edge-triggered D flip flop; a signal input end of the positive edge-triggered D flip flop is configured to receive the first synchronization signal, and a clock input end of the positive edge-triggered D flip flop is configured to receive the frequency division signal, so that the positive edge-triggered D flip flop synchronizes the first synchronization signal and the positive edge of the frequency division signal so as to generate the second synchronization signal.

8. The signal generating circuit according to claim 1, wherein the frequency dividing circuit comprises a first frequency dividing circuit and a second frequency dividing circuit; the first frequency dividing circuit is a frequency divider, the first frequency dividing circuit is configured to receive the clock signal and to decrease a frequency of the clock signal so as to generate a first frequency division signal, and a frequency of the first frequency division signal is twice a preset frequency; the second frequency dividing circuit is a divide-by-2 frequency divider, and the second frequency dividing circuit is configured to receive the first frequency division signal and perform a divide-by-2 frequency division operation on the first frequency division signal so as to generate the frequency division signal.

9. The signal generating circuit according to claim 8, wherein the second frequency dividing circuit comprises a positive edge-triggered D flip flop and a NAND gate; a clock input end of the positive edge-triggered D flip flop is configured to receive the first frequency division signal, two input ends of the NAND gate are configured to simultaneously receive an output of the positive edge-triggered D flip flop, a signal input end of the positive edge-triggered D flip flop is configured to receive an output of the NAND gate, and the output of the NAND gate serves as the frequency division signal.

10. The signal generating circuit according to claim 1, wherein the synthesis circuit comprises an AND gate; and the AND gate performs the AND operation on the second synchronization signal and the frequency division signal so as to output the full-cycle signals.

11. A signal generating method for generating a plurality of full-cycle signals within a signal duration of a beacon signal, the signal generating method comprises:
    synchronizing the beacon signal and a first signal edge of a clock signal by a first synchronization circuit so as to generate a first synchronization signal;

performing a frequency division operation on the clock signal by a frequency dividing circuit so as to generate a frequency division signal;

synchronizing the first synchronization signal and a second signal edge of the frequency division signal by a second synchronization circuit so as to generate a second synchronization signal; and performing an AND operation on the second synchronization signal and the frequency division signal by a synthesis circuit so as to output the full-cycle signals.

12. The method according to claim 11, wherein a divisor of the frequency dividing circuit is configured so that a product of a cycle of the frequency division signal and a number of the full-cycle signals is less than or equal to the signal duration, and a duty cycle of the frequency division signal is 50%.

13. The method according to claim 11, wherein the first signal edge of the clock signal is a positive edge of the clock signal, the first synchronization circuit comprises a positive edge-triggered D flip flop; and the step of synchronizing the beacon signal and the first signal edge of the clock signal by the first synchronization circuit so as to generate the first synchronization signal comprises:

receiving the beacon signal by a signal input end of the positive edge-triggered D flip flop and receiving the clock signal by a clock input end of the positive edge-triggered D flip flop, so that the positive edge-triggered D flip flop synchronizes the beacon signal and the positive edge of the clock signal so as to generate the first synchronization signal.

14. The method according to claim 11, wherein the first signal edge of the clock signal is a negative edge of the clock signal, the first synchronization circuit comprises a negative edge-triggered D flip flop; and the step of synchronizing the beacon signal and the first signal edge of the clock signal by the first synchronization circuit so as to generate the first synchronization signal comprises:

receiving the beacon signal by a signal input end of the negative edge-triggered D flip flop and receiving the clock signal by a clock input end of the negative edge-triggered D flip flop, so that the negative edge-triggered D flip flop synchronizes the beacon signal and the negative edge of the clock signal so as to generate the first synchronization signal.

15. The method according to claim 11, wherein the second signal edge of the frequency division signal is a negative edge of the frequency division signal, and the second synchronization circuit comprises:

a positive edge-triggered D flip flop; and
an inverter circuit;

the step of synchronizing the first synchronization signal and the second signal edge of the frequency division signal by the second synchronization circuit so as to generate the second synchronization signal comprises:

receiving and inverting the frequency division signal by the inverter circuit so as to generate an inverse frequency division signal; and receiving the first synchronization signal by a signal input end of the positive edge-triggered D flip flop and receiving the inverse frequency division signal by a clock input end of the positive edge-triggered D flip flop so that the positive edge-triggered D flip flop synchronizes the first synchronization signal and the negative edge of the frequency division signal so as to generate the second synchronization signal.

16. The method according to claim 11, wherein the second signal edge of the frequency division signal is a negative edge of the frequency division signal, the second synchronization circuit comprises a negative edge-triggered D flip flop; and the step of synchronizing the first synchronization signal and the second signal edge of the frequency division signal by the second synchronization circuit so as to generate the second synchronization signal comprises:

receiving the first synchronization signal by a signal input end of the negative edge-triggered D flip flop and receiving the frequency division signal by a clock input end of the negative edge-triggered D flip flop so that the negative edge-triggered D flip flop synchronizes the first synchronization signal and the negative edge of the frequency division signal so as to generate the second synchronization signal.

17. The method according to claim 11, wherein the second signal edge of the frequency division signal is a positive edge of the frequency division signal, the second synchronization circuit comprises a positive edge-triggered D flip flop; and the step of synchronizing the first synchronization signal and the second signal edge of the frequency division signal by the second synchronization circuit so as to generate the second synchronization signal comprises:

receiving the first synchronization signal by a signal input end of the positive edge-triggered D flip flop and receiving the frequency division signal by a clock input end of the positive edge-triggered D flip flop so that the positive edge-triggered D flip flop synchronizes the first synchronization signal and the positive edge of the frequency division signal so as to generate the second synchronization signal.

18. The method according to claim 11, wherein the frequency dividing circuit comprises a first frequency dividing circuit and a second frequency dividing circuit; the first frequency dividing circuit is a frequency divider, and the second frequency dividing circuit is a divide-by-2 frequency divider; the step of performing the frequency division operation on the clock signal by the frequency dividing circuit so as to generate the frequency division signal, wherein the duty cycle of the frequency division signal is 50%, comprises:

receiving the clock signal and decreasing the frequency of the clock signal by the first frequency dividing circuit so as to generate the first frequency division signal, wherein the frequency of the first frequency division signal is twice a preset frequency; and receiving the first frequency division signal and performing a divide-by-2 frequency division operation on the first frequency division signal by the second frequency dividing circuit so as to generate the frequency division signal.

19. The method according to claim 18, wherein the second frequency dividing circuit comprises a positive edge-triggered D flip flop and a NAND gate; the step of receiving the first frequency division signal and performing the divide-by-2 frequency division operation on the first frequency division signal by the second frequency dividing circuit so as to generate the frequency division signal comprises:

receiving the first frequency division signal by a clock input end of the positive edge-triggered D flip flop, simultaneously receiving an output of the positive edge-triggered D flip flop by two input ends of the NAND gate, receiving an output of the NAND gate by a signal input end of the positive edge-triggered D flip flop, and serving the output of the NAND gate as the frequency division signal.

20. The method according to claim 11, wherein the synthesis circuit comprises an AND gate; the step of performing the AND operation on the second synchronization signal and the frequency division signal by the synthesis circuit so as to output the full-cycle signals comprises: performing the AND operation on the second synchronization signal and the frequency division signal by the AND gate so as to output the full-cycle signals.

* * * * *